United States Patent

Kunz

[15] 3,667,117

[45] June 6, 1972

[54] ELECTROLUMINESCENT DIODE CONFIGURATION AND METHOD OF FORMING THE SAME

[72] Inventor: Hans J. Kunz, Raleigh, N.C.

[73] Assignee: Corning Glass Works, Corning, N.Y.

[22] Filed: Feb. 28, 1969

[21] Appl. No.: 803,216

[52] U.S. Cl. ..................................29/576, 29/569, 148/187, 317/235, 313/108

[51] Int. Cl. ........................................B01j 17/00, H01l 7/00

[58] Field of Search .............29/569 L, 572, 576; 317/235 N; 313/108 D

[56] References Cited

UNITED STATES PATENTS

| | | | |
|---|---|---|---|
| 3,150,299 | 9/1964 | Noyce | 317/235 |
| 3,330,991 | 7/1967 | Lavine et al. | 317/235 |
| 3,496,429 | 2/1970 | Robinson | 317/235 |
| 3,501,679 | 3/1970 | Yonezu et al. | 317/235 |

*Primary Examiner*—John F. Campbell
*Assistant Examiner*—W. Tupman
*Attorney*—Sughrue, Rothwell, Mion, Zinn & Macpeak

[57] ABSTRACT

An electroluminescent diode which includes an electromagnetic radiation emitting PN junction formed by diffusing, into both surfaces of a semiconductor slice of a first conductivity, a dopant material of opposite type conductivity. Contact metallizations are mounted within windows in an insulating barrier which covers said diode so as to form electrical contacts engaging both the N and P type areas of the diode. An annular reflector metallization pad is mounted on the surface of the device over the PN junction and spaced from one surface of the semiconductor material by the insulating coating so as to reflect light out through the surface opposite to that on which an anti-reflection coating has been placed.

7 Claims, 6 Drawing Figures

ELECTROLUMINESCENT DIODE CONFIGURATION AND METHOD OF FORMING THE SAME

BACKGROUND OF THE INVENTION

1. Field of the Invention

The present invention is directed to an electroluminescent diode device wherein a PN junction formed within the device emits electromagnetic radiation which is directed out through one surface of the device by means of a reflector positioned on the opposite surface relative to the junction so as to guide or direct the radiation out through a specific portion of the device. The junction is formed by diffusing a P type dopant into various portions of an N type semiconductor material in a manner so as to produce a specifically shaped and positioned PN junction.

2. Description of the Prior Art

It is well known that certain diode structures fabricated from IV—IV, III–V and II–VI materials exhibit the phenomenon of injection electroluminescence. Diodes have been manufactured in various configurations so as to accentuate the strength and brilliance of the emitted electroluminescence while at the same time prohibiting any portions of the diode structure from obscuring or absorbing the emitted radiation as it passes out through a desired portion or surface of the diode structure. Prior art devices and methods of fabricating radiation emitting diodes suffer from the problem of specifically and efficiently forming the PN junction in the desired position within the semiconductor device such that radiation emitted from the PN junction is directed out through a given area by the most efficient means. Prior art methods have included relatively exotic and, consequently, expensive means to accomplish this purpose and, to date, none of the prior art electroluminescent diode configurations combine simple and inexpensive means of directing light out through a specific portion of the device while at the same time precisely and specifically forming and positioning the PN junction within the device so as to more efficiently allow the emitted radiation to be directed.

SUMMARY OF THE INVENTION

The radiation emitting diode configuration of the subject invention includes the PN junction positioned within the device and formed so as to emit radiation from the junction within the device in a specified direction out through one portion or surface of the device. Specific radiation direction is accomplished by positioning reflectors in relation to the PN junction so as to guide or reflect the radiation in the direction desired while at the same time providing a simple and inexpensive means of forming the reflector on the device. into It is common for electroluminescent diode devices of this type to have contact pad means to which electrical conductors are attached so as to provide electrical contact with the N and P type areas of the diode structure. The present invention utilizes the necessity of creating these contact pads for an additional useful purpose by forming the contacts from metallization pads on one surface of the device. The metallizations are placed in designated windows in an insulating or barrier surface coating on one surface of the device where the coating provides additional protection to the designated surface of the diode device. A reflector portion is provided over the PN junction by increasing the size of one of these contact metallization pads so as to overlap the PN junction which extends up to the corresponding surface of the device. The extended flange on the designated metallization pad is separated from the surface of the N or P type material by the insulating coating. The reflector flange is shaped to cover the entire PN junction and in the embodiment presented may be annular.

Alternately, the reflector metallization may be formed so that it is not integral with the designated contact metallization but is merely formed in an annular or ring-like shape corresponding to the shape of the PN junction and separated both from the contact metallizations and the surface of the semiconductor material by the insulating coating or surface barrier. It can readily be seen that the reflector metallization provides an efficient and easily mounted reflector assembly in that the reflector metallization may be formed along with the contact metallization and also may be formed of the same material and in the same step.

Precise and accurate positioning of the PN junction within an electroluminescent diode structure is accomplished by diffusing a dopant into a semiconductor slice of a first type conductivity at specific areas of the original semiconductor slice. The subject invention solves the problem of precise PN junction positioning by diffusing the dopant material into the semiconductor slice at specific locations from both sides of the semiconductor slice. As noted earlier, one surface of the semiconductor slice is coated with an insulating coating and windows are placed at specific points through the insulator coating both for the purpose of diffusion and placing the metallization contact pads. Consequently, the PN junction is formed by diffusing the dopant of opposite conductivity into the semiconductor material through one of the specified windows in the insulating coating and at the same time the dopant is diffused generally uniformly into the semiconductor slice from the opposite surface. Diffusing of the dopant into the opposite surface is done generally uniformly over the entire surface such that the dopant diffuses into the surface to a substantially uniform degree and thereby alters the conductivity type of the entire opposite surface. The dopant material will be diffused into the opposite surface to a sufficient depth so as to cause the diffused regions from both surfaces to meet.

Consequently, a PN junction is formed within the device which terminates or extends to the coated surface in a generally cylindrical configuration due to the dopant material being diffused through a generally circular shaped window in the insulator coating. The other extremities of the PN junction may extend towards the edges of the device in such a manner that this part of the PN junction lies in a plane substantially parallel to both surfaces. Alternately, the dopant may be diffused into the semiconductor material in such a manner as to terminate the other extremities of the PN junction on the opposite surface from that coated by the insulated material. This, of course, would result in additional radiation emitted from that surface.

DESCRIPTION OF THE PREFERRED EMBODIMENT

Figures 1, 2, 3, 4, 5, 6:
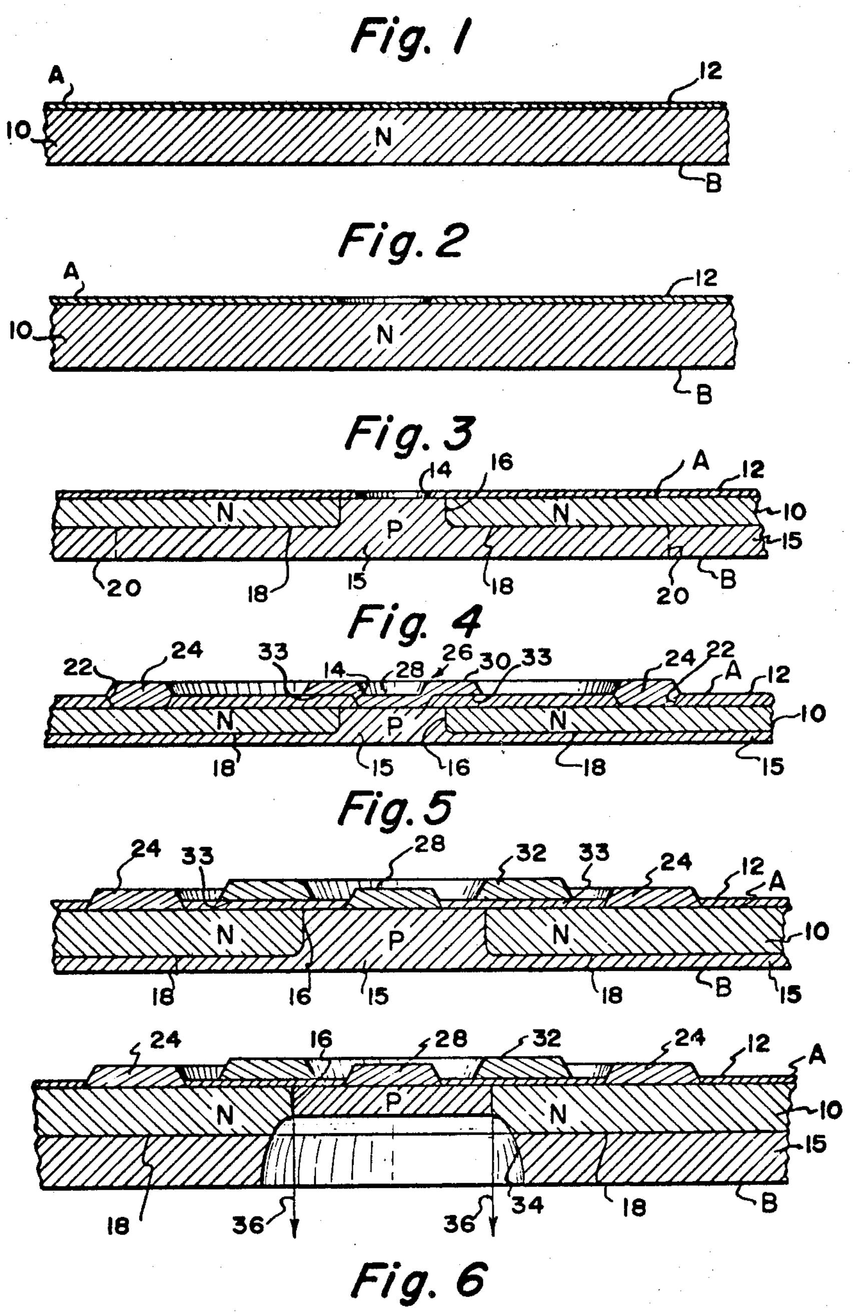
FIGS. 1, 2 and 3 are longitudinal cross sections of the structure showing successive steps in the process for fabricating the electroluminescent diode in accordance with the present invention.
FIGS. 4 and 5 are longitudinal sections with the contact and reflector metallizations in place.
FIG. 6 is a longitudinal section of yet another embodiment of the device of the present invention.

FIGS. 1 through 3 illustrate various steps of fabrication of the electroluminescent diode. In FIG. 1, a semiconductor material 10, which may be for example N type GaAs or like material, is used as the base slice and has a coating 12 of insulator material such as silicon dioxide. The device is fabricated by first sawing, lapping and polishing both surfaces of the N type material so as to prepare it for further production steps. The coating 12 of insulator material is placed on one surface A of the semiconductor device in any manner will known in the art.

Thereafter, as shown in FIG. 2, windows are etched through the insulator coating 12 for subsequent diffusion of a dopant material into the N type material at specified locations. At the same time, as shown in FIG. 3, the P type doped region is formed by diffusing P type dopant material substantially into the entire surface B so as to penetrate to a uniform depth into the device. The P type dopant 15 diffused through window 14 produces a cylindrical P type column which eventually engages the diffused P type layer created by uniform diffusion into the opposite surface B. The portion 16 of the PN junction formed by diffusion through window 14 terminates at surface A in a generally annular shape. Similarly, the portion 18 of the PN junction is formed extending parallel to both surfaces A and B and terminates at the edge of the semiconductor device. Alternately, the opposite extremities of the PN junction may terminate at surface B in a larger annular area as designated by the dotted lines 20. This may be accomplished by diffusing the dopant material into surface B at designated portions instead of uniformly over the entire surface B as described above.

After forming the PN junction by diffusing into both surfaces of the device, the metallization pads 26 and 24 are placed on surface A through appropriate windows 14 and 22, respectively, as shown in FIG. 4, which are positioned at designated areas both over the P type regions and the N type regions of the semiconductor material. The metallizations may be formed by uniformly depositing metal over the surface A in any known manner and etching away any unwanted metal portions to leave the desired metal pattern such as shown in FIGS. 4, 5 or 6. After the metallizations are formed on surface A, the entire thickness of the device may be reduced by uniformly etching the entire surface B thereby uniformly removing layers of the P type material from surface B and decreasing the thickness of the device.

The embodiment of the present invention shown in FIG. 4 comprises contact metallization 24 extending through designated window 22 in the insulator coating 12 so as to engage the N type material. Similarly, a metallization generally indicated at 26 is placed so as to contact the P type region. The metallizations 24 and 26 all serve as contact metallizations which are provided to attach an electrical conductor thereto so as to electrically communicate the device to a voltage source or other electrical components. The metallization pad, generally indicated at 26, in addition to acting as a contact metallization, also serves as a reflector for the radiation emitted from the PN junction 16 towards surface A. This is accomplished by forming the metallization 26 with a central portion 28 to which an electrical conductor may be attached, and an annular metallization flange 30. Flange 30 extends out of the window 14 and over the insulator coating 12 so as to not come in contact with the P or N type materials and thereby cause a short circuit. The annular flange 30 is shaped so as to conform to the shape of the PN junction 16 and, of course, may be of any designated configuration as long as flange 30 is fabricated to overlap a portion of surface A at which PN junction 16 terminates.

The embodiment shown in FIG. 5 is formed similarly as that embodiment shown in FIG. 4, described above, except for the forming of the reflector metallizations 32. The embodiment shown in FIG. 5 differs only in that the reflector metallization 32 is formed in an annular ring which is spaced from surface A by the insulator coating 12. The reflector 32 is formed in an annular shape so as to conform with the annular shape of the PN junction 16 and it is positioned on the insulator coating 12 over the portion of surface A at which the PN junction 16 terminates.

Consequently, the embodiments shown in both FIGS. 4 and 5 disclose a reflector assembly mounted on an insulator coating and spaced from the surface A of the semiconductor material where the reflector is formed in the general shape of the PN junction so as to efficiently reflect or direct light out through the opposite surface B of the electroluminescent diode. In operation, electromagnetic radiation is emitted from PN junction 16 towards both surfaces A and B of the device. Due to the positioning of the reflector metallization the radiation emitted from the PN junction towards surface A will be reflected from the bottom surface 33 of the reflector metallization flange 30 and reflector metallization 32 thereby directing the radiation out through surface B of the device.

In addition, an anti-reflection coating may be placed over surface B so as to increase the amount of light issuing from surface B directly from the PN junction and from the reflector metallization.

FIG. 6 shows yet another embodiment of said invention wherein a window 34 is formed into the semiconductor device from surface B. The window may be formed by etching or any like manner and extends to a depth within the device sufficient to engage the PN junction 16 and thereby eliminate or prohibit the radiation 36 emitted from both the PN junction directly and the reflectors indirectly from being absorbed in the P type material extending below the portion 16 of the PN junction. The precise shape of the window as shown in FIG. 6 is considered representative only and serves merely as an example to show the concept of removal of a portion of the surface through which the radiation 36 is emitted to prevent unnecessary absorbing and, consequently, wasting of radiation desired to be emitted from surface B of the device.

In the description of the embodiments of the present invention, the PN junction is formed by diffusing P type material into both surfaces of an N type semiconductor slice. It should be noted, however, that the invention encompasses those embodiments where the position of the N and P type material are reversed such that a PN junction is formed by an N type dopant being diffused into both surfaces of a P type semiconductor slice. As stated previously, the present invention is directed to the production of an electroluminescent diode structure fabricated from compounds of IV—IV, III–V and II–VI materials in order to produce an electromagnetic radiation emitting PN junction.

I claim:

1. A method of producing an electroluminescent diode structure of the type having a PN junction from which electromagnetic radiation is directed through at least one of two surfaces of the structure, the method comprising:
   a. forming a semiconductor slice having first and second surfaces and being of a first type conductivity;
   b. coating the first surface of said slice with an insulating film;
   c. forming at least one window through the insulator coating;
   d. diffusing dopant material of opposite type conductivity into said first surface through said window and substantially uniformly into the second surface to depths whereby the diffused regions formed in said semiconductor material meet to form a PN junction having one end terminating at the first surface;
   e. mounting metallization contact pads in engagement with the first surface of the device, and
   f. forming metallization reflectors on the insulating coating such that it is correspondingly shaped and positioned above the PN junction.

2. A method of producing a diode structure as in claim 1 further comprising diffusing the dopant material into both surfaces so as to form a substantially cylindrical PN junction portion having one end terminating at the first surface in a substantially annular shape.

3. A method of producing a diode structure as in claim 1 further comprising: forming said metallization reflector integral with a metallization contact pad such that the reflector is spaced above the PN junction extending to said first surface.

4. A method of producing a diode structure as in claim 1 further comprising: uniformly etching away the second surface after the dopant material has been diffused therein, until a desired thickness of the structure is reached.

5. A method of producing a diode structure as in claim 1 further comprising: forming a window in the structure extending inwardly from the second surface to a sufficient depth to intersect the PN junction whereby radiation emitted from the PN junction is directed out of the device through the window.

6. A method of producing a diode structure as in claim 1 further comprising: diffusing the dopant material into selected portions only of the second surface such that one extremity of the PN junction extends to the second surface.

7. A method of producing a diode structure as in claim 1 further comprising: coating said second surface with an anti-reflection coating.

* * * * *